United States Patent
Akiyama et al.

[11] Patent Number: 5,954,772
[45] Date of Patent: Sep. 21, 1999

[54] APPARATUS FOR DETECTING ABNORMALITEY OF CLOCK IN MICROCOMPUTER USED FOR MOTOR VEHICLE

[75] Inventors: Kenichi Akiyama, Tochigi; Hideki Ogata, Miyagi, both of Japan

[73] Assignee: Honda Giken Kogyo Kabushiki Kaisha, Tokyo, Japan

[21] Appl. No.: 08/853,126

[22] Filed: May 8, 1997

[30] Foreign Application Priority Data

Jul. 26, 1996 [JP] Japan .................................. 8-198141

[51] Int. Cl.$^6$ ...................................................... G06F 11/00
[52] U.S. Cl. ................................ 701/29; 701/1; 377/39
[58] Field of Search ................................ 701/1, 29, 31, 701/34; 702/176, 177, 178, 89; 371/61, 62, 67.1; 377/28, 39

[56] References Cited

U.S. PATENT DOCUMENTS

| 4,304,003 | 12/1981 | Kakizawa et al. .................. 371/62 |
| 4,541,050 | 9/1985 | Honda et al. ........................ 701/29 |
| 4,597,052 | 6/1986 | Matsuda ............................. 701/31 |
| 5,657,361 | 8/1997 | Inagaki et al. ..................... 377/39 |
| 5,677,838 | 10/1997 | Itou et al. ......................... 701/34 |

FOREIGN PATENT DOCUMENTS 6-83474  3/1994  Japan .

*Primary Examiner*—Gary Chin
*Attorney, Agent, or Firm*—Merchant & Gould P.C.

[57] ABSTRACT

An apparatus for detecting the abnormality of a clock in a microcomputer used for a motor vehicle includes a reference clock generator for generating a reference clock signal required for operation of the microcomputer, a pulse signal generator for generating a pulse signal of a constant period based on an instruction signal from the microcomputer, a comparator for comparing the pulse signal from the pulse signal generator and the reference clock signal from the reference clock generator and producing a comparison signal based on the result of comparison, and a determining circuit for determining, based on the comparison signal from the comparator, whether or not the reference clock signal is normal. An indicator is enabled only when the reference clock signal is in the abnormal state. The abnormality of the reference clock can be detected without requiring a separate oscillator used for generating an additional clock signal for comparison with the reference clock signal.

8 Claims, 5 Drawing Sheets

APPARATUS FOR DETECTING ABNORMALITEY OF CLOCK IN MICROCOMPUTER USED FOR MOTOR VEHICLE

BACKGROUND OF THE INVENTION

1. Field of the Invention:

The present invention relates to a clock abnormality detecting apparatus for detecting the abnormality of a clock in a microcomputer installed in a controller used for motor vehicles.

2. Description of the Related Art:

A conventional clock abnormality detecting apparatus is disclosed in Japanese Patent Laid-Open Publication No. HEI 6-83474, which comprises a reference clock oscillator for generating a reference clock pulse or signal that schedules the operation of a microcomputer, and another clock oscillator for generating a second clock pulse or signal. The reference clock signal and the second clock signal are compared with each other so that the abnormality of the reference clock signal or the reference clock generator can be detected according to the result of comparison.

To this end, the disclosed clock abnormality detecting apparatus includes a comparator for performing comparison between the reference clock signal and the second clock signal. The comparator is composed of a plurality of flip-flops connected in tandem or cascade so that when the reference clock signal is normal, a judgment signal at the output of the flip-flops is high, and when the reference clock signal is not normal (due, for example, to malfunctioning of the reference clock oscillator), a judgment signal at the output of the flip-flops is low.

However, due to the separate clock oscillator required to produce the second clock signal in addition to the reference clock signal for the purpose of determining the normality/abnormality of the reference clock signal, the conventional clock abnormality detecting apparatus is rendered complicated in construction and expensive to manufacture.

The separate clock oscillator may pose another problem that when the separate clock oscillator is in the abnormal condition due to operation failure, for example, the reference clock signal and the reference clock oscillator are determined as being not normal even though they are in the normal condition.

SUMMARY OF THE INVENTION

A clock abnormality detecting device of the present invention for detecting the abnormality of a clock pulse or signal in a microcomputer installed in a control system or controller for controlling the operation of a motor vehicle, generally comprises: a reference clock generator for generating a reference clock signal required for operation of the microcomputer; at least one signal output device for producing a pulse signal of a constant period on the basis of an instruction signal from the microcomputer; a comparator for comparing the pulse signal from the signal output device and the reference clock signal from the reference clock generator and producing a comparison signal based on the result of comparison, and a determining circuit for determining, based on the comparison signal from the comparator, whether or not the reference clock signal is normal. When the reference clock signal is in the abnormal state, this abnormal state can be detected and hence determined based on a comparison made between the reference clock signal and the constant period pulse signal produced from the signal output device.

Preferably, the signal output device is a nonvolatile memory that produces a memory write termination signal of a constant period on the basis of an instruction signal from the microcomputer. The memory write termination signal is used as the above-mentioned constant period pulse signal to determine whether or not the reference clock signal is normal. Since the nonvolatile memory is used also as the signal output device, the apparatus is made simple in construction and reduced in cost.

In another preferred form, the signal output device is constituted by a sensor used for detecting a condition of the motor vehicle and producing a sensor signal representing the detected condition of the motor vehicle. The sensor signal is used as the aforesaid constant period pulse signal in order to determine whether or not the reference clock signal is normal. The sensor used also as the signal output device poses a certain degree of structural simplification of the apparatus and lowers the cost of the apparatus.

The above and features and advantages of the present invention will become more apparent from the following description when making reference to the detailed description and the accompanying sheets of drawings in which preferred structural embodiments incorporating the principles of the present invention are shown by way of illustrated example.

DETAILED DESCRIPTION OF THE PREFERRED EMBODIMENTS

Now, certain preferred embodiments of the present invention will be described below in greater detail with reference to the accompanying drawings.

The present invention has been made in effect to realize a detecting apparatus by which the abnormality of a reference clock pulse or signal in a microcomputer used for a motor vehicle can be detected reliably and economically without requiring an additional oscillating circuit used for generating a clock pulse or signal other than the reference clock signal, but utilizing the function of a component used in a controlling system or controller for the motor vehicle.

Figure 1:
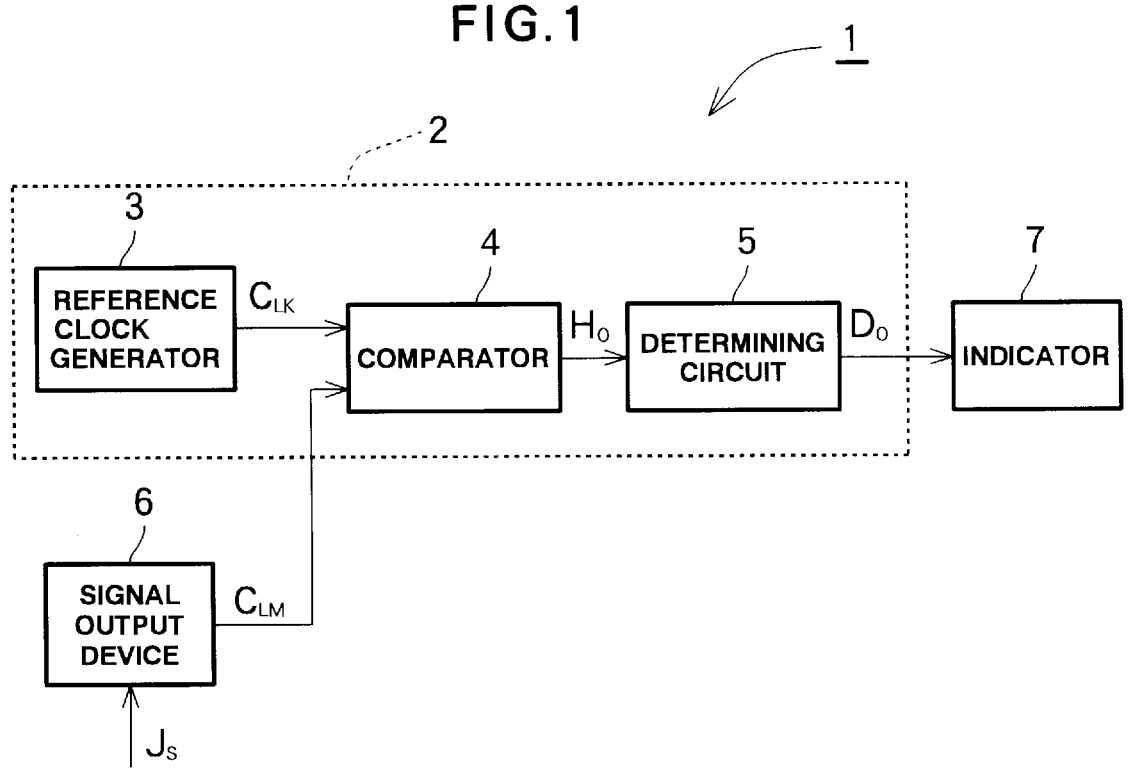
FIG. 1 is a block diagram showing a main portion of a clock abnormality detecting apparatus for a microcomputer used for a motor vehicle according to one embodiment of the present invention.

FIG. 1 shows in block diagram a main portion of a clock abnormality detecting apparatus for detecting the abnormality of a clock pulse or signal in a microcomputer used for a motor vehicle according to the present invention.

As shown in FIG. 1, the clock abnormality detecting apparatus 1 generally comprises a microcomputer 2, a signal output device 6, and an indicator 7. The microcomputer 2 includes a reference clock generator 3, a comparator 4 and a determining circuit 5.

The reference clock generator 3 has externally connected components including an oscillating element such as a piezoelectric quartz-crystal plate or a piezoelectric ceramic plate, and capacitors used for the frequency regulation. The reference clock generator 3 generates a periodic reference clock pulse of signal $C_{LK}$ used to schedule the operation of the microcomputer 2 and sends the reference clock signal $C_{LK}$ to all functional blocks or components (not shown) of the microcomputer 2. The reference clock signal $C_{LK}$ is also supplied to the comparator 4.

The comparator 4 has the function of a timer operable under the control of software, and includes a temporary storage circuit such as registers, an arithmetic unit and so forth. The comparator 4 times a period $T_{LK}$ of the reference clock signal $C_{LK}$ supplied from the reference clock generator 3 and then temporarily stores the period $T_{LK}$ together with a piece of information about whether the period is zero ($T_{LK}=0$) or positive ($T_{LK}>0$).

In addition, the comparator 4 times a period $T_{LM}$ of a pulse signal $C_{LM}$ supplied from the signal output device 6 and then temporarily stores the period $T_{LM}$ together with a piece of information about whether the period $T_{LM}$ is zero ($T_{LM}=0$) or positive ($T_{LM}>0$). The period $T_{LM}$ of the pulse signal $C_{LM}$ is longer than the period $T_{LK}$ of the reference clock signal $C_{LK}$.

The period $T_{LK}$ and the period $T_{LM}$ that are temporarily stored in the registers are subjected to an arithmetic operation which is performed in the comparator 4 on the basis of a sampling pulse (not shown) so as to calculate or compute the ratio of the period $T_{LK}$ to the period $T_{LM}$ ($=T_{LK}/T_{LM}$) or the deviation of the period $T_{LK}$ from the period $T_{LM}$ ($=T_{LM}-T_{LK}$). The thus calculated ratio ($T_{LK}/T_{LM}$) or deviation ($T_{LM}-T_{LK}$) is then supplied, as a comparison signal $H_0$, from the comparator 4 to the determining circuit 5.

Figure 2:
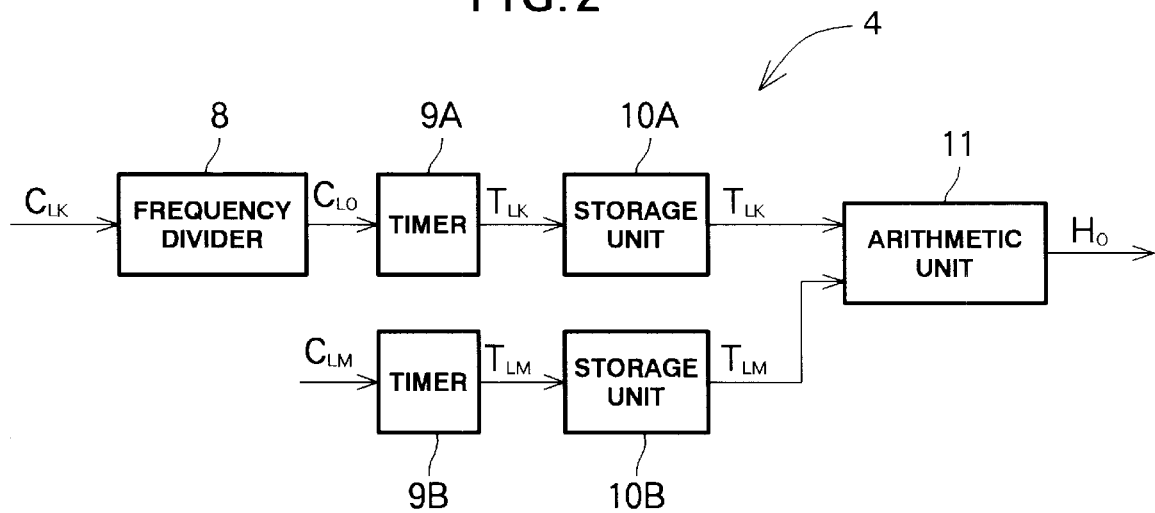
FIG. 2 is a block diagram showing a comparator of the clock abnormality detecting apparatus.

FIG. 2 shows in block diagram an example of the comparator 4. As shown in this figure, the comparator 4 has a frequency divider, two timers 9A and 9B, two storage units 10A and 10B, and an arithmetic unit 11.

The frequency divider 8 is composed of a counter, for example, and divides down the frequency of the reference clock signal $C_{LK}$ by a given integral number n and then supplies a frequency-divided reference clock pulse or signal $C_{L0}$ to the timer 9A.

In the frequency divider 8, the number n is set such that the frequency of the reference clock signal $C_{LK}$ is approximated to the frequency of the constant period pulse signal $C_{LM}$ to thereby facilitate the calculation and subsequent processing of the ratio of the period $T_{LK}$ to the period $T_{LM}$ ($=T_{LK}/T_{LM}$) or the deviation of the period $T_{LK}$ from the period $T_{LM}$ ($=T_{LM}-T_{LK}$). Accordingly, in the case where the reference clock signal $C_{LK}$ and the pulse signal $C_{LM}$ are close with each other in terms of frequency, the frequency divider 8 can be omitted.

The timers 9A, 9B are each composed of a software-controlled timer and they time a period $T_{LK}$ of the reference clock signal $C_{L0}$ and the period $T_{LM}$ of the constant period pulse signal $C_{LM}$, respectively, and supply the thus timed periods $T_{LK}$ and $T_{LM}$ to the storage units 10A and 10B, respectively.

The storage units 10A, 10B are each composed of a memory such as a register, and they temporarily store the period $T_{LK}$ of the reference clock signal $C_{10}$ and the period $T_{LM}$ of the constant period pulse signal $C_{LM}$, respectively, and then supply the thus stored periods $T_{LK}$ and $T_{LM}$ to the arithmetic unit 11 under the control of a timing pulse (not shown).

The arithmetic unit 11 has the function of a divider or a subtracter operable under the control of software, for example, and it calculates or computes the ratio of the period $T_{LK}$ to the period $T_{LM}$ ($=T_{LK}/T_{LM}$) or the deviation of the period $T_{LK}$ from the period $T_{LM}$ ($=T_{LM}-T_{LK}$) and, thereafter, supplies the thus calculated ratio or the deviation (having a positive value) to the determining circuit 5 as a comparison signal $H_0$.

The temporary storage circuit stores therein a zero (0) value for each of the period $T_{LK}$ and the period $T_{LM}$, in order to preclude the result of calculation from becoming disabled when the period $T_{LM}$ becomes equal to zero (0) during calculation of the period ratio ($T_{LK}/T_{LM}$).

The pulse signal $C_{LM}$ supplied from the signal output device 6 is so set as to always have a constant period $T_{LM}$ regardless of the frequency ($1/T_{LK}$) of the reference clock signal $C_{LK}$, as described later.

Thus, once the frequency ($1/T_{LK}$) of the reference clock signal $C_{LK}$ from the reference clock generator 3 is set, it is possible to detect the comparison signal $H_0$ at a constant value which is generated as a result of calculation of the period ratio ($T_{LK}/T_{LM}$) or the deviation ($T_{LM}-T_{LK}$).

This means that when the reference clock signal $C_{LK}$ is not delivered, or even when the microcomputer 2 encounters a trouble tending to cause a great change in frequency due to some reasons, the abnormality in the reference clock signal $C_{LK}$ can be detected from the comparison signal $H_0$.

The determining circuit 5 has a memory such as an ROM, the function of a comparator operable under the control of software, and the function of a logic operation unit. The determining circuit 5 compares the comparison signal $H_0$ supplied from the comparator 4 with an allowable upper limit and an allowable lower limit that are set in advance for the comparison signal $H_0$. If the comparison signal $H_0$ is within an allowable range defined between an upper limit and a lower limit, the determining circuit 5 judges the reference clock signal $C_{LK}$ to be normal and then supplies a judgment signal $D_0$ to the ndicator 7. On the other hand, if the comparison signal $H_0$ xceeds the allowable range defined between the upper and lower imits, the determining circuit 5 judges the reference clock signal $C_{LK}$ to be in the abnormal state and then supplies a judgment signal $D_0$ to the indicator 7.

Figure 3:
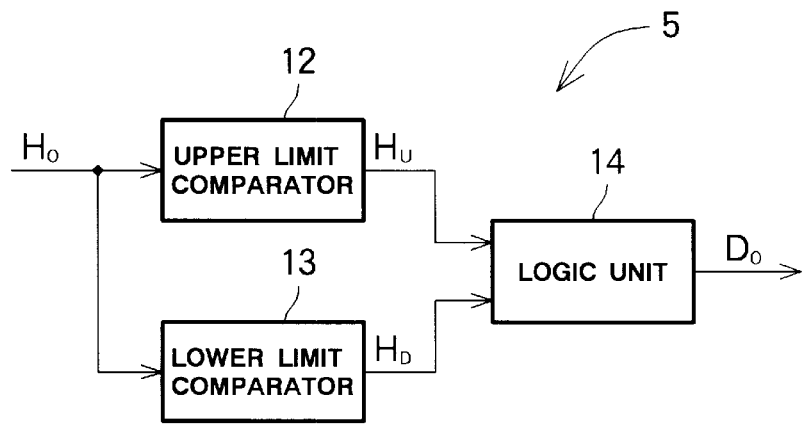
FIG. 3 is a block diagram showing a determining circuit of the clock abnormality detecting apparatus.

FIG. 3 shows in block diagram an example of the determining circuit 5. As shown in this figure, the determining circuit 5 includes an upper limit comparator 12, a lower limit comparator 13, and a logic unit 14.

The upper limit comparator 12 has the function of a comparator operable under the control of software, and an upper limit $T_{MAX}$ of the ratio ($T_{LK}/T_{LM}$) or the deviation ($T_{LM}-T_{LK}$) between the period $T_{LK}$ and the period $T_{LM}$ which is set in advance in the memory such as the ROM. When the comparison signal $H_0$ is supplied from the comparator 4, the upper limit comparator 12 compares the comparison signal $H_0$ with the upper limit $T_{MAX}$. If the comparison signal $H_0$ exceeds the upper limit $T_{MAX}$, the upper limit comparator 12 supplies an upper limit comparison signal $H_u$ at the high level to the logic unit 14. Conversely, if the comparison signal $H_0$ is below the upper limit $T_{MAX}$, the upper limit comparator 12 supplies an upper limit comparison signal $H_U$ at the low level to the logic unit 14.

Similarly, the lower limit comparator 13 has the function of a comparator operable under the control of software, and a lower limit $T_{MIN}$ of the ratio ($T_{LK}/T_{LM}$) or the deviation ($T_{LM}-T_{LK}$) between the period $T_{LK}$ and the period $T_{LM}$ which is set in advance in the memory such as the ROM. When the comparison signal $H_0$ is supplied from the comparator 4, the lower limit comparator 13 compares the comparison signal $H_0$ with the lower limit $T_{MIN}$. If the comparison signal $H_0$ exceeds the upper limit $T_{MIN}$, the lower limit comparator 13 supplies a lower limit comparison signal $H_D$ at the high level to the logic unit 14. Conversely, if the comparison signal $H_0$ is below the lower limit $T_{MIN}$, the lower limit comparator 13 supplies a lower limit comparison signal $H_D$ at the low level to the logic unit 14.

The logic unit 14 has the EXCLUSIVE-OR function and performs the EXCLUSIVE-OR operation for the upper limit comparison signal $H_U$ supplied from the upper limit comparator 12 and the lower limit comparison signal $H_D$ supplied from the lower limit comparator 13, and then produces a judgment signal $D_0$.

For instance, if the comparison signal $H_0$ exceeds the upper limit $T_{MAX}$ ($H_0 > T_{MAX}$), the upper limit comparison signal $H_U$ and the lower limit comparison signal $H_D$ are both at the high level and, hence, the judgment signal $D_0$ of the EXCLUSIVE-OR operation is at the low level.

Similarly, if the comparison signal $H_0$ is not greater than or below the lower limit $T_{MIN}$ ($H_0 < T_{MIN}$), the upper limit comparison signal $H_U$ and the lower limit comparison signal $H_D$ are both at the low level and, hence, the judgment signal $D_0$ of the EXCLUSIVE-OR operation is at the low level.

On the other hand, if the comparison signal $H_0$ is equal to and not smaller than the lower limit $T_{MIN}$ and is equal to and not greater than the upper limit $T_{MAX}$ ($T_{MIN} \leq H_0 \leq T_{MAX}$), the upper limit comparison signal $H_U$ is at the low level and the lower limit comparison signal $H_D$ is at the high level and, hence, the judgment signal $D_0$ of the EXCLUSIVE-OR operation is at the high level.

Thus, the determining circuit 5 is able to determine whether the reference clock signal $C_{LK}$ is normal or not depending on the state of the judgment signal $D_0$ which goes high if the reference clock signal $C_{LK}$ is normal, and changes to low if the reference clock signal $C_{LK}$ is not normal.

The signal output device 6 is composed of a pulse signal generator which generates a pulse signal $C_{LM}$ of a constant period $T_{LM}$ in accordance with an instruction signal $J_S$ supplied from the microcomputer 2. The pulse signal $C_{LM}$ of the constant period $T_{LM}$ is set always constant in its period regardless of the frequency ($1/T_{LK}$) of the reference clock signal $C_{LK}$. The thus generated pulse signal $C_{LM}$ is supplied to the comparator 4.

The indicator 7 is composed of a visual indicator or an audio indicator and indicates, based on the judgment signal $D_0$ supplied from the determining circuit 5, the abnormality of the reference clock signal $C_{LK}$ by way of a visual sign or indication using an LED (light emitting diode) or an audio or speech sound from a speaker, only when the judgment signal $D_0$ is low (i.e., the reference clock signal $C_{LK}$ is in the abnormal state).

As described above, the clock abnormality detecting apparatus of a microcomputer for a motor vehicle according to the present invention comprises a reference clock generator 3 for generating a reference clock signal $C_{LK}$, a signal output device 6 for outputting a pulse signal $C_{LM}$ having a constant period based on an instruction signal $J_S$ from the microcomputer 2, a comparator 4 for comparing the pulse signal $C_{LM}$ from the signal output device 6 with the reference clock signal $C_{LM}$ from the reference clock pulse generator 3 and producing a comparison signal $H_0$ representing the result of comparison, and a determining circuit 5 for making, based on the comparison signal $H_0$, determination as to whether or not the reference clock signal $C_{LK}$ is normal based on the comparison signal $H_0$ from the comparator 4. With this construction, when the reference clock signal $C_{LK}$ is in the abnormal state, this abnormal state of the reference clock signal $C_{LK}$ can be detected and hence determined based on the comparison made between the reference clock signal $C_{LK}$ and the constant period pulse signal $C_{LM}$ generated from the signal output device 6.

Now will be described of the construction of hardware of the clock abnormality detecting apparatus of the present invention.

Figure 4:
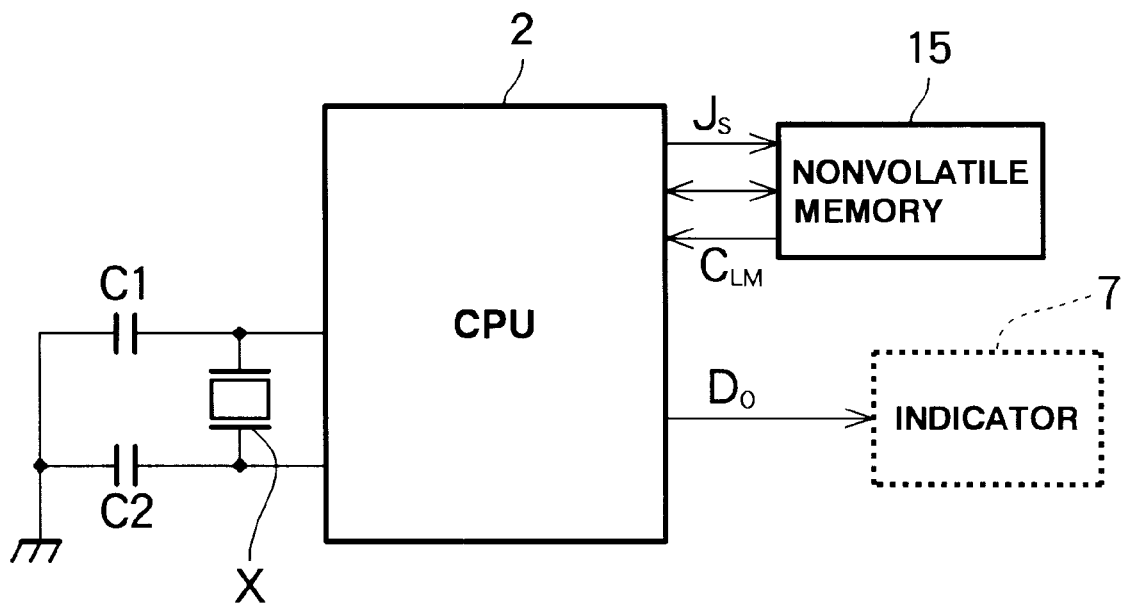
FIG. 4 is a block diagram showing the general construction of one embodiment of the clock abnormality detecting apparatus according to the present invention.

FIG. 4 shows one example of the clock abnormality detecting device according to the present invention. As shown in this figure, the clock abnormality detecting apparatus includes a microcomputer 2, externally connected components including an oscillating element X and capacitors C1, C2 for regulating the frequency of the reference clock signal $C_{LK}$, a nonvolatile memory 15 constituting the signal output device shown in FIG. 1, and an indicator 7.

The microcomputer 2 contains within it an oscillator circuit (i.e., the reference clock generator 3 shown in FIG. 1) that generates a reference clock signal $C_{LK}$ at a frequency which is equal to a reference frequency (oscillation frequency) of the oscillating element X. The microcomputer 2 also supplies a data read-out instruction signal $J_S$ to the nonvolatile memory 15.

The oscillating element X is preferably a piezoelectric quartz-crystal plate or element so as to secure generation of a reference clock signal $C_{LK}$ at a high, precise and stable frequency.

By the use of the oscillating element X whose oscillation frequency is equal to that of a reference clock signal $C_{LK}$ to be generated, the reference clock generator 3 is able to generate the clock signal $C_{LK}$ at a precise frequency.

The nonvolatile memory 15 outputs data at a constant timing based on the instruction signal $J_S$ supplied from the microcomputer 2, and supplies a pulse signal (BUSY signal) $C_{LM}$ having a constant period $T_{LM}$ (see FIG. 2) to the microcomputer 2 each time recording or writing of data completes.

Figure 6:
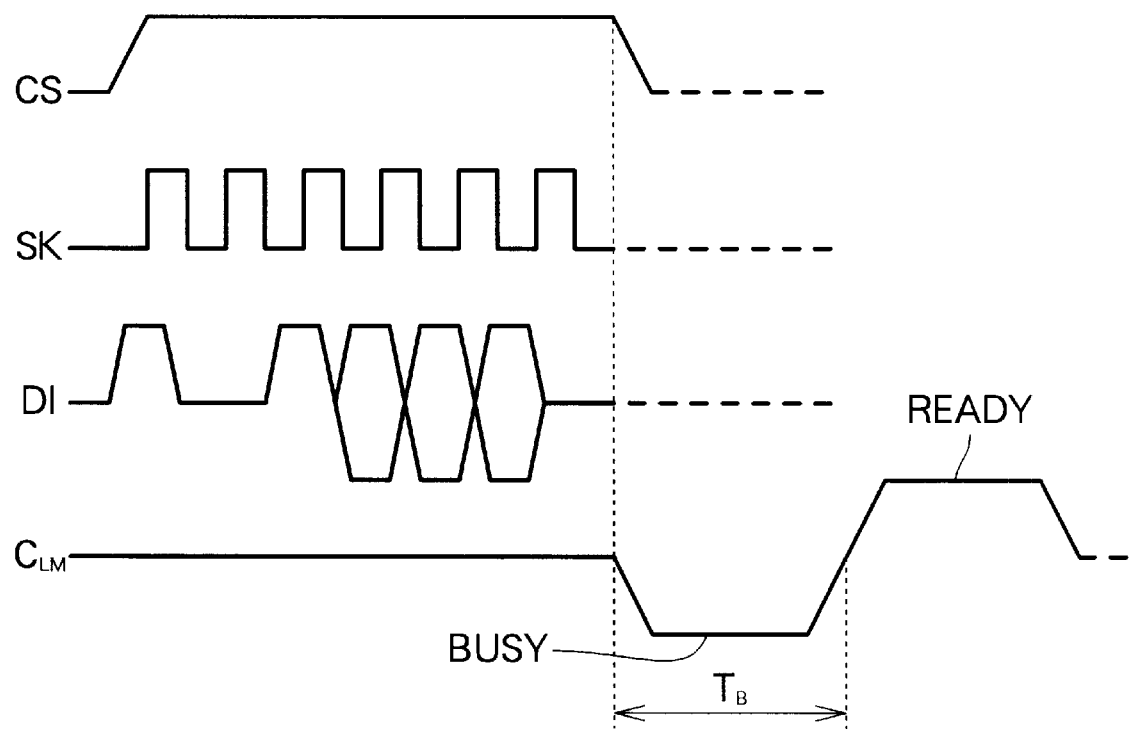
FIG. 6 is a view showing signal waveforms in a nonvolatile memory of a clock abnormality detecting apparatus according to the present invention.

FIG. 6 shows signal waveforms in the nonvolatile memory 15, in which a signal CS is a chip select signal, a signal SK is a clock pulse, a signal DI is a piece of data read from the nonvolatile memory 15, and a signal $C_{LM}$ is a BUSY signal generated after data recording is completed, the BUSY signal being used as a pulse signal having a constant period.

The BUSY signal forming the constant period pulse signal $C_{LM}$ is generated at the fall of the chip select signal CS and continues for a given period of time $T_B$.

Figure 7:
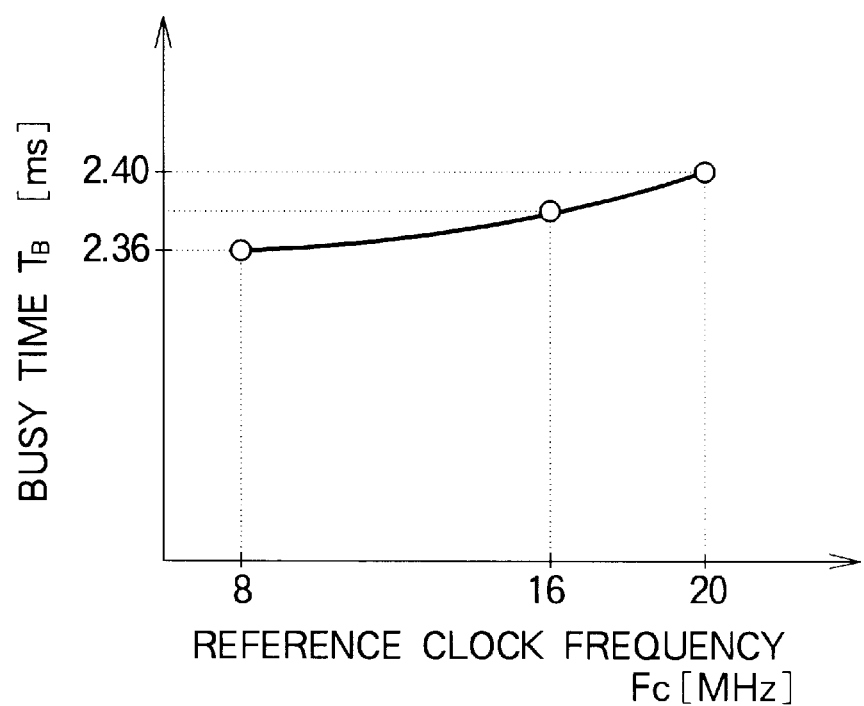
FIG. 7 is a diagram showing the relationship between the busy time and the reference clock frequency of the clock abnormality detecting apparatus according to the present invention.

FIG. 7 shows a graphical representation of the BUSY time (TB) vs. reference clock frequency ($F_C$) characteristic obtained according to the present invention.

As appears clear from FIG. 7, the BUSY time $T_B$ (constant period $T_{LM}$) is kept substantially at a constant value (2.36–2.4 ms) even when the frequency of the reference clock signal $C_{LK}$ changes greatly (from 8 to 20 Mhz).

When the BUSY signal continuing for the given period of time $T_B$ is supplied as a pulse signal $C_{LM}$ to the microcomputer 2, the comparator 4 and the determining circuit 5 contained within the microcomputer 2 as shown in FIG. 1 perform in succession comparison between the reference clock signal $C_{LK}$ and the pulse signal $C_{LM}$ and judgment to determine whether or not the reference clock signal $C_{LK}$ is normal. If the reference clock signal $C_{LK}$ is judged to be in the abnormal state, the indicator 7 indicates the abnormal state of the reference clock signal $C_{LK}$ based on the judgment signal $D_0$.

Since the signal output device 6 is formed by the nonvolatile memory 15 and generates a memory write termination signal (BUSY signal) of a constant period $T_B$ according to an instruction signal $J_S$ from the microcomputer 2, the memory write termination signal can be used as a pulse signal $C_{LM}$ of a constant period $T_{LM}$ to determine as to whether or not the reference clock signal $C_{LK}$ is normal.

Figure 5:
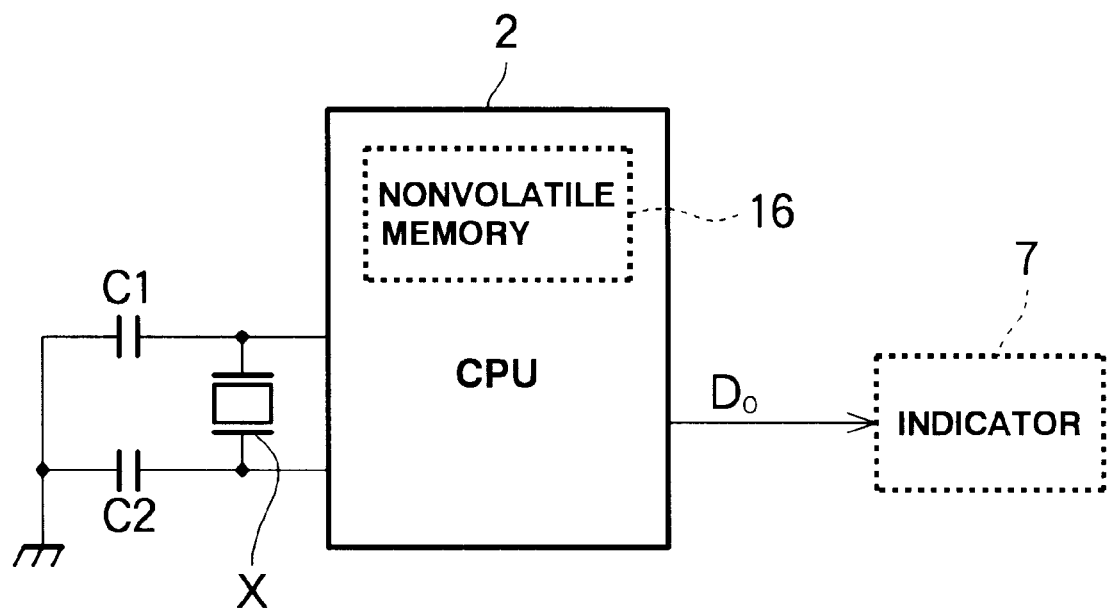
FIG. 5 is a block diagram showing the general construction of another embodiment of the clock abnormality detecting apparatus according to the present invention.

FIG. 5 illustrates another example of the clock abnormality detecting apparatus according to the present invention. The illustrated apparatus differs from the apparatus shown in FIG. 4 in that the nonvolatile memory 16 is contained within the microcomputer 2 and, hence, the microcomputer 2 is a one-chip microcomputer.

Since the microcomputer 2 is a one-chip microcomputer containing within it the nonvolatile memory 15, the normality/abnormality of the reference clock signal $C_{LK}$ can be determined without requiring any component to be added separately.

Figure 8:
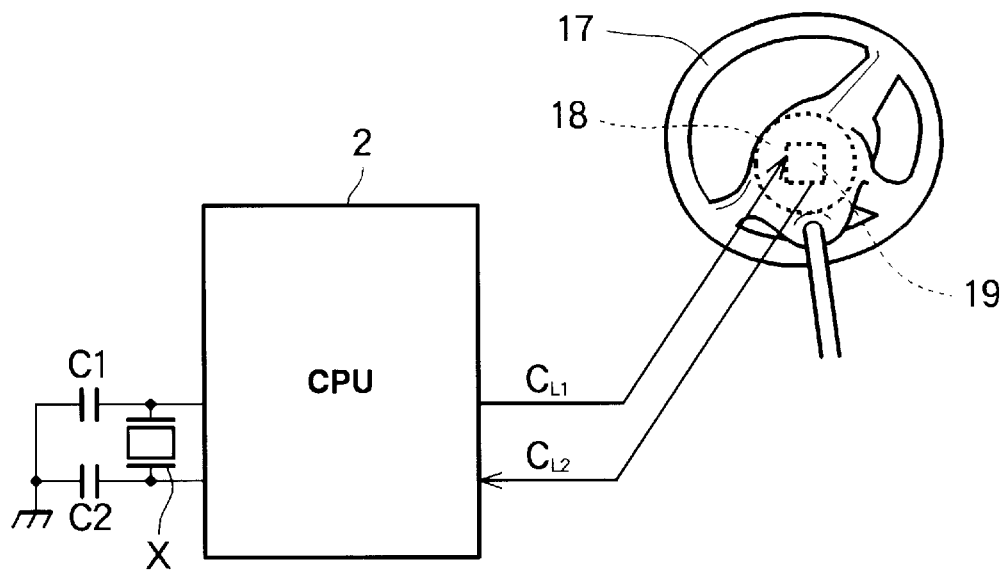
FIG. 8 is a block diagram showing a further embodiment of the clock signal abnormality detecting apparatus according to the present invention in which a collision sensor is used as a signal output device.

FIG. 8 shows an embodiment of the clock abnormality detecting apparatus of the present invention in which a collision sensor is used as a signal output device.

As shown in FIG. 8, the collision sensor 19 forming the signal output device 6 (FIG. 1) is associated with an air bag system 18 of a motor vehicle. When a microcomputer 2 installed in the motor vehicle supplies an instruction signal $C_{L1}$ to the collision sensor 18, the collision sensor 19 sends a sensor signal $C_{L2}$ of a constant period to the microcomputer 2 in the same manner as the nonvolatile memory 15 shown in FIG. 4.

The sensor signal $C_{L2}$ supplied from the collision sensor 19 to the microcomputer 2 as a pulse signal $C_{LM}$ is first compared with the reference clock signal $C_{LK}$ by the comparator 4 contained within the microcomputer 2. Subsequently, the determining circuit 5 also contained within the microcomputer 2 makes a judgment to determine whether or not the reference clock signal $C_{LK}$ is normal, and then sends out a judgment signal $D_0$.

In the embodiment shown in FIG. 8, the signal output device utilizes a collision sensor 19 selected from various sensors mounted on the motor vehicle. Accordingly to the invention, it is possible to replace the collision sensor 19 with another sensor or an electric component of the type wherein a sensor signal $C_{L2}$ of a constant period is generated regardless of the reference frequency of the reference clock signal $C_{LK}$.

Since the signal output device according to the present invention is formed by a sensor which is capable of generating a sensor signal $C_{L2}$ representing a detected condition of the motor vehicle, the normality/abnormality of the reference clock signal $C_{LK}$ can be determined by using the sensor signal $C_{L2}$ as a pulse signal having a constant period.

Now, description will be given of the detection timing of the clock abnormality detecting apparatus according to the present invention.

Figure 9:
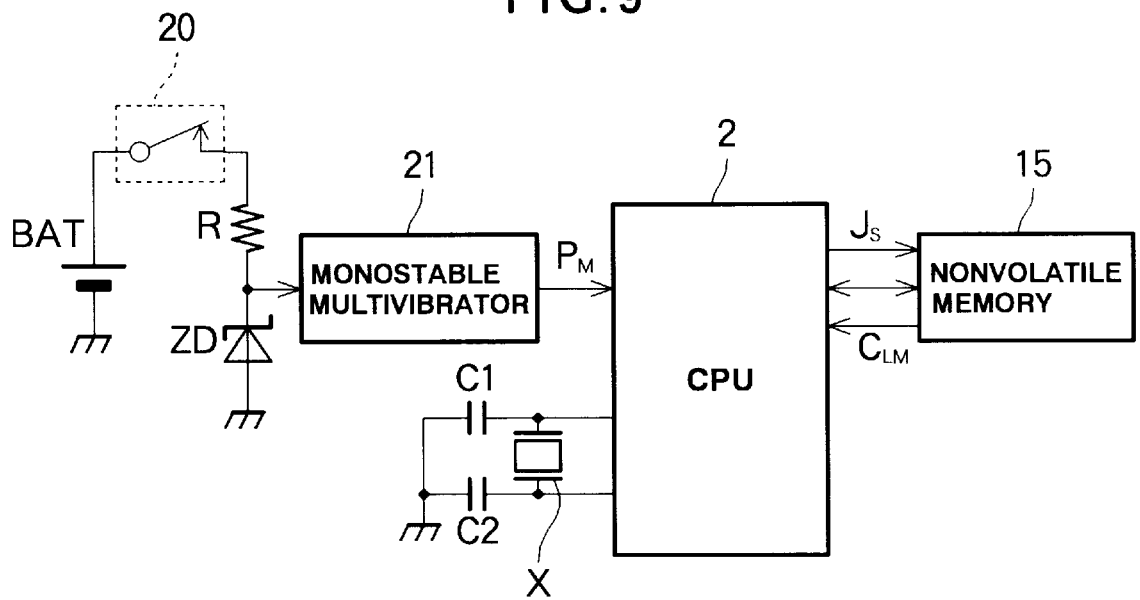
FIG. 9 is a block diagram showing an application of the clock abnormality detecting apparatus of FIG. 4 in which the clock abnormality detection is performed when an engine of the motor vehicle gets started.

FIG. 9 shows an application of the clock abnormality detecting apparatus of FIG. 4, in which the clock abnormality detection is performed when an ignition switch is turned on to start up an engine of the motor vehicle.

As shown in FIG. 9, the ignition switch 20 is manually turned on whereupon a direct current (DC) power (information about the ignition key position) is applied from a battery (BAT) via a resistor R and a constant-voltage semiconductor device ZD to a monostable multivibrator 21 which supplies a one-shot (single) pulse $P_M$ to the microcomputer 2.

Using the one-shot pulse $P_M$ as a trigger, the microcomputer 2 supplies an instruction signal $J_S$ to the nonvolatile memory 15 to determine whether or not the reference clock signal $C_{LK}$ is normal, based on a BUSY signal issued as a constant period pulse signal $C_{LM}$ after writing of data into the nonvolatile memory 15 is completed.

In the illustrated embodiment, since the microcomputer 2 sends out the instruction signal $J_S$ based on information about the ignition key position only when the engine of the motor vehicle is started, abnormality determination of the reference clock signal $C_{LK}$ is performed only at the start of the motor vehicle engine.

In the embodiments described above, the abnormality determination of the reference clock signal $C_{LK}$ is performed on the assumption that the constant period pulse signal $C_{LM}$ generated from the signal output device is normal. However, even though the reference clock signal $C_{LK}$ is normal, if the constant period pulse signal $C_{LM}$ is not normal, the reference clock signal $C_{LK}$ is judged to be not normal.

One preferred measure taken to deal with a trouble in the signal output device will be described below with reference to FIG. 1.

In this case, the signal output device 6 shown in FIG. 1 consists of a plurality of signal output devices 6 (a total number of which is n) each producing a pulse signal $C_{LM}$ of a constant period. The plural (n) pulse signals $C_{LM}$ are supplied into the determining circuit 5 in which an average value $C_{ALM}$ of the n pulse signals $C_{LM}$ ($C_{LM1}$–$C_{LMn}$) is stored in advance. The determining circuit 5 calculates or computes the ratio of the constant period pulse signals $C_{LM}$ ($C_{LM1}$–$C_{LMn}$) to the average value $C_{ALM}$ (=$C_{LM}(C_{LM1}$–$C_{LMn})/C_{ALM}$) or the deviation of the constant period pulse signals $C_{LM}$ ($C_{LM1}$–$C_{LMn}$) from the average value $C_{ALM}$ (=$C_{LM}(C_{LM1}$–$C_{LMn})$–$C_{ALM}$) and, by comparing the thus computed ratio or the deviation with criteria having an allowable range, it determines the abnormality of the constant period pulse signals $C_{LM}$ ($C_{LM1}$–$C_{LMn}$) and identifies any signal output device having a trouble.

For the reference clock signal $C_{LK}$ the abnormality determination can be performed in the same manner as already described above with reference to FIG. 1. Thus, the abnormality determination can be performed even when one or both of the reference clock generator 3 and the signal output device 6 are in the abnormal state.

Since the clock abnormality detecting apparatus 1 of the foregoing construction is provided with a plurality of signal output devices 6, and since the determining circuit 6 identifies any signal output device 6 being in trouble based on the constant period pulse signals $C_{LM}$ ($C_{LM1}$–$C_{LMn}$) delivered from the respective signal output devices 6, it is possible to determine not only the abnormality of the reference clock generator 3 but also the abnormality of the signal output devices 6.

Obviously, various minor changes and modifications of the present invention are possible in the light of the above teaching. It is therefore to be understood that within the scope of the appended claims the invention may be practiced otherwise than as specifically described.

What is claimed is:

1. A controller for controlling the operation of a motor vehicle, including a microcomputer and an apparatus for detecting the abnormality of a clock signal in the microcomputer, said apparatus comprising:

a reference clock generator for generating a reference clock signal required for operation of the microcomputer;

at least one signal output device for producing a pulse signal of a constant period based on an instruction signal from the microcomputer;

a comparator for comparing said pulse signal from said signal output device and said reference clock signal from said reference clock generator and producing a comparison signal based on the result of comparison; and a determining circuit for determining, based on said comparison signal from said comparator, whether or not said reference clock signal is normal.

2. An apparatus according to claim 1, wherein said signal output device is a nonvolatile memory.

3. An apparatus according to claim 1, wherein said signal output device is a sensor for detecting a condition of the motor vehicle and producing a sensor signal representing the detected condition of the motor vehicle.

4. An apparatus according to claim 1, wherein said reference clock generator includes a crystal oscillating element capable of oscillating at a frequency which is equal to a frequency of said reference clock signal.

5. An apparatus according to claim 1, wherein said instruction signal from said microcomputer is produced based on information about the position of an ignition key of the motor vehicle only when an engine of the motor vehicle is started.

6. An apparatus according to claim 1, wherein said microcomputer is a one-chip microcomputer containing within it a nonvolatile memory, said nonvolatile memory forming said signal output device.

7. An apparatus according to claim 1, wherein the number of said signal output device is plural, and said determining circuit identifies any of said plural signal output devices while being in the abnormal state, on the basis of respective constant period pulse signals produced from said plural signal output devices.

8. An apparatus according to claim 1, further including an indicator for indicating the abnormality of the reference clock signal based on the result of determination by said determining circuit.

\* \* \* \* \*

UNITED STATES PATENT AND TRADEMARK OFFICE
CERTIFICATE OF CORRECTION

PATENT NO. : 5,954,772
DATED : September 21, 1999
INVENTOR(S) : Akiyama et al.

It is certified that error appears in the above-identified patent and that said Letters Patent is hereby corrected as shown below:

Title page, item [54], "ABNORMALITEY" should read --ABNORMALITY--.

[73], Assignee, please delete "Honda Giken Kogyo Kabushiki Kaisha, Tokyo, Japan" and replace with --Keihin Corporation, Tokyo, Japan--.

Signed and Sealed this

Twenty-ninth Day of February, 2000

Attest:

Q. TODD DICKINSON

Attesting Officer

Commissioner of Patents and Trademarks

UNITED STATES PATENT AND TRADEMARK OFFICE
CERTIFICATE OF CORRECTION

PATENT NO.    : 5,954,772                                     Page 1 of 1
DATED         : September 21, 1999
INVENTOR(S)   : Akiyama et al It is certified that error appears in the above-identified patent and that said Letters Patent is hereby corrected as shown below:

Title page, section [54], "ABNORMALITEY" should read -- ABNORMALITY --.

Title page, section [73], Assignee, please delete "Honda Giken Kogyo Kabushiki Kaisha, Tokyo, Japan" and replace with -- Keihin Corporation, Tokyo, Japan --.

Signed and Sealed this

Eighteenth Day of September, 2001

*Attest:*

*Attesting Officer*

NICHOLAS P. GODICI
*Acting Director of the United States Patent and Trademark Office*